United States Patent
Liu et al.

(10) Patent No.: US 8,048,807 B2
(45) Date of Patent: Nov. 1, 2011

(54) METHOD AND APPARATUS FOR THINNING A SUBSTRATE

(75) Inventors: Ming Chyi Liu, Hsinchu (TW); Yao Fei Chuang, Tainan (TW); Martin Liu, Yonghe (TW); Gwo-Yuh Shiau, Hsinchu (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 485 days.

(21) Appl. No.: 12/205,269

(22) Filed: Sep. 5, 2008

(65) Prior Publication Data
US 2010/0062611 A1    Mar. 11, 2010

(51) Int. Cl.
*H01L 21/302* (2006.01)
*H01L 21/461* (2006.01)
(52) U.S. Cl. ........ 438/689; 438/690; 438/691; 438/692; 438/693
(58) Field of Classification Search .................. None
See application file for complete search history.

(56) References Cited

U.S. PATENT DOCUMENTS

| 4,681,657 A | 7/1987 | Hwang et al. |
| 4,971,654 A * | 11/1990 | Schnegg et al. ............. 438/752 |
| 5,801,084 A * | 9/1998 | Beasom et al. ............. 438/457 |
| 6,569,343 B1 * | 5/2003 | Suzuki et al. ................ 216/27 |
| 6,657,178 B2 * | 12/2003 | Aebi ...................... 250/214 VT |
| 2009/0227047 A1 * | 9/2009 | Yang et al. ...................... 438/8 |

OTHER PUBLICATIONS

Reiche et al., "Wafer Thinning: Techniques for Ultra-thin Wafers," Advanced Packaging, Mar. 2003, http://ap.pennnet.com/Articles/Article_Display, 7 pages.

* cited by examiner

*Primary Examiner* — Duy Deo
(74) *Attorney, Agent, or Firm* — Haynes and Boone, LLP

(57) ABSTRACT

Provided is a method for fabricating a semiconductor device that includes providing a semiconductor substrate having a front side and a backside, where active or passive devices are formed in the front side, rotating the semiconductor substrate, and etching the backside of the semiconductor substrate by introducing a first etchant while the substrate is rotated, the first etchant including an R—COOH.

19 Claims, 7 Drawing Sheets

METHOD AND APPARATUS FOR THINNING A SUBSTRATE

BACKGROUND

The present disclosure relates generally to semiconductor manufacturing and, more particularly, to a method and apparatus for thinning a substrate.

In semiconductor technologies, a silicon substrate may be employed and may undergo various processes to form active and passive devices therein. One such process includes thinning the substrate by various techniques such as grinding, chemical mechanical polishing (CMP), and etching. For example, backside-illuminated (BSI) image sensor devices are used for sensing a volume of radiation (e.g., light) projected towards the back surface of a substrate. To do this, an image sensor device uses an array of image sensor elements (e.g., pixels). Each image sensor element includes at least one radiation sensing element, described herein, as a photodetector. The photodetectors may be formed on the front side of the substrate, and then a face to face (e.g., front side to front side) bonding with a carrier (support) material may be performed to avoid the risk of device wafer warping following thinning, the substrate being thin enough to allow the radiation incident on the back surface of the substrate to reach the photodetectors. A thin substrate may be advantageous in reducing optical and/or electrical cross-talk between image sensor elements. Thinning the substrate from the back surface involves grinding the substrate and etching the substrate. However, it may be difficult to control an etch rate due to the highly reactive chemicals that are used to etch the substrate. Further, the surface topography of the substrate after etching may not be uniform due to various factors such as different etch rates at different areas on the substrate and the fierce chemical reactions of the etching process. This can adversely affect subsequent processes such as depth of focus (DOF) in photolithography and device optical performance such as sensitivity and cross-talk.

Therefore, what is needed is an improved method and apparatus for thinning a semiconductor substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to image sensors and more particularly, to a backside-illuminated image sensor. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Moreover, the formation of a first feature over, on, overlapping, overlying, underlying and the like, a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, or on a surface of a substrate, may include embodiments where features are formed above the surface of the substrate, adjacent to the surface of the substrate, directly on the surface of the substrate, and/or extending below the surface of the substrate (such as implanted regions).

Figure 1:
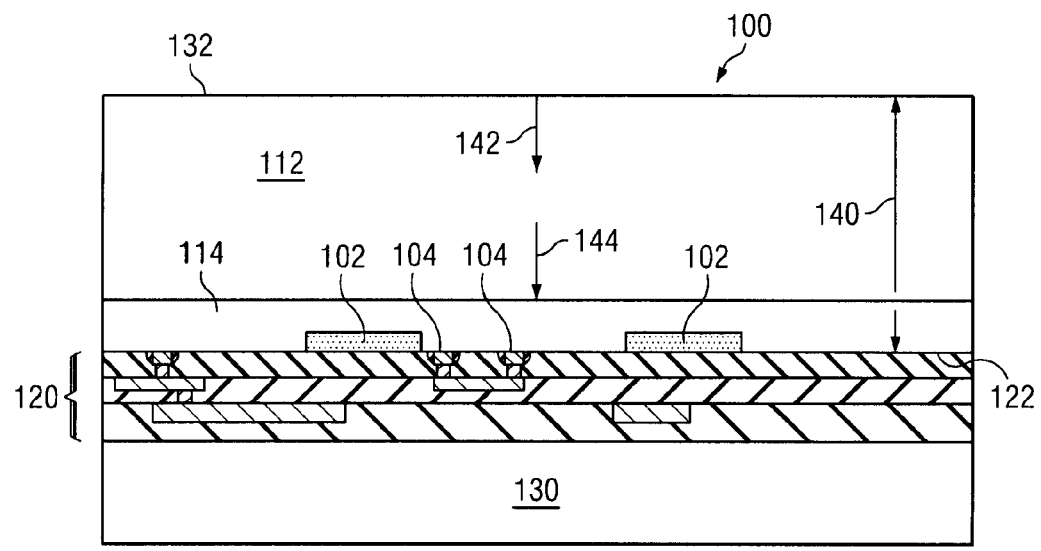
FIG. 1 is a cross sectional view of a backside illuminated sensor (BSI) device at an intermediate stage of fabrication.

Referring to FIG. 1, illustrated is a backside illuminated (BSI) sensor device 100 at an intermediate stage of fabrication. The BSI sensor device 100 may include an array of image sensor elements 102 (e.g. pixels). The BSI sensor device 100 may be a complementary metal oxide semiconductor (CMOS) image sensor (CIS) or active pixel sensor. In other embodiments, the BSI sensor device 100 is a charge coupled device (CCD) sensor or passive pixel sensor. The image sensor elements 102 may include photodetectors for measuring an intensity or brightness of radiation. In an embodiment, the photodetector may include a photodiode. In a further embodiment, the photodetector includes a pinned photodiode. Other examples of photodetectors include photogate detectors, phototransistors, and/or other detectors known in the art. The image sensor elements 102 may also include various transistors 104 such as reset transistors, source follower transistors, selector transistors, and/or transfer transistors. Additional circuitry and input/outputs are typically provided adjacent to the array of image sensor elements 102 for providing an operation environment for the image sensor elements 102 and for supporting external communications with the image sensor elements.

The BSI sensor device 100 may be fabricated by CMOS processing techniques known in the art. The BSI sensor device 100 may include a semiconductor substrate 112. The semiconductor substrate 112 may include silicon in a crystalline structure. The substrate 112 may further include an epitaxial (epi) layer 114 grown on a substrate layer. The epi layer may include a dopant of the same type or a different type than the underlying substrate layer. In the present embodiment, the epi layer 114 is a p− layer and is formed on a p+ substrate layer. The p− layer may be formed by doping the substrate 112 with a p-type dopant such as boron, $BF_2$, or other suitable material known in the art. The doping may be accomplished using conventional processes such as ion implantation or diffusion. It is understood that other doping configurations may be implemented such as an epi layer that includes an n− layer formed on an n+ doped substrate layer. The n− layer may be formed by doping the substrate with an n-type dopant such as phosphorus, arsenic, or other suitable material known in the art. In yet another embodiment, the epi layer may include a p− layer and may be formed on an n doped substrate layer.

The BSI sensor device 100 may further include additional layers 120, including interconnect metal layers and inter-layer dielectric, formed on a front side 122 of the substrate 112. The interconnect metal layers provide connections between the various microelectronic devices of the BSI sensor device 100. The inter-layer dielectric may include a low-k material, as compared to a dielectric constant of silicon dioxide. Alternatively, the inter-layer dielectric may include carbon-doped silicon oxide, fluorine-doped silicon oxide, silicon oxide, silicon nitride, and/or organic low-k material. The inter-layer dielectric may be formed by a technique including spin-on, CVD, or sputtering. The material of the metal layers may include aluminum, copper, tungsten, titanium, titanium nitride, tantalum, tantalum nitride, metal silicide or combination thereof. Additionally, the interconnect metal layers and inter-layer dielectric may be formed in an integrated process such as a damascene process or lithography/plasma etching process. The BSI sensor device 100 may further include a passivation layer for protecting the sensor device.

A carrier wafer 130 may be bonded to substrate 112 at the front side 122 so that processing the backside 132 of the substrate 112 may be performed. The carrier wafer 130 may provide protection for the various features formed on the front side 112, and may provide mechanical strength and support when processing the backside 132 of the substrate 112. As discussed above, the BSI sensor device 102 may include image sensor elements 102 that are formed on the front side 122 of the substrate 112. Accordingly, the substrate 112 may be processed to be made thin enough to allow the radiation incident on the backside 132 of the substrate 112 to reach the image sensor elements 102. For example, the BSI sensor device 102 (at this stage) may have a thickness 140 that is about 723 μm (8 inches) thick. The substrate 112 may be thinned down from the backside 132 by various techniques as discussed below.

The backside 132 of the substrate 112 may first undergo a grinding process to thin 142 the substrate 112 to a thickness of about 50 μm. It is understood that the particular thicknesses disclosed herein are mere examples and that other thickness may be implemented depending on the type of application and design requirements of the semiconductor device. The grinding process may have a high removal rate and is well suited for removing a substantial portion of the substrate 112 in a short period of time. However, the grinding process may result in a rough backside surface having a total thickness variation of about 2 to 6 μm, and may cause damage to a portion of the substrate 112 that may extend 10 μm from the backside surface. Accordingly, after the grinding process, the substrate 112 may undergo subsequent processing to remove 144 the remaining p+ substrate layer including the damaged portion.

Figure 2:
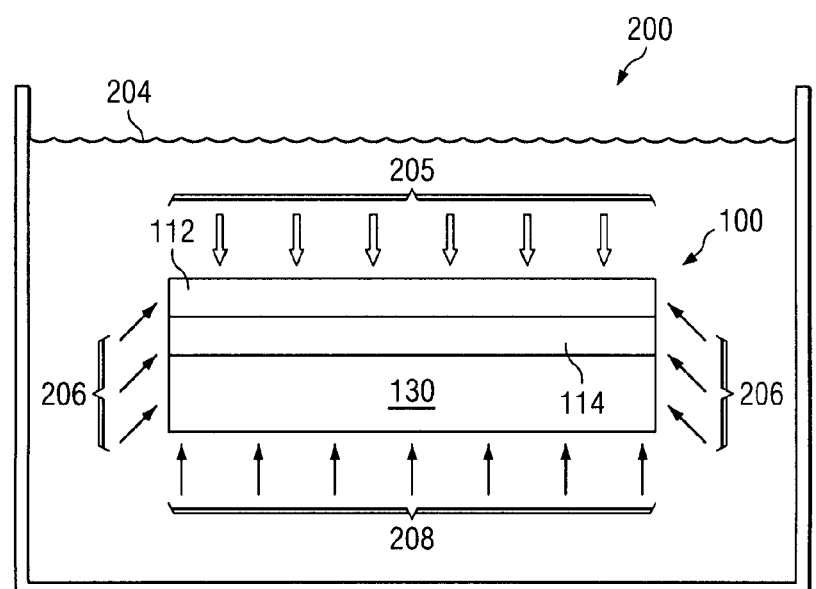
FIG. 2 is a cross sectional view of the BSI device of FIG. 1 being processed at a wet etch bench.

Referring to FIG. 2, illustrated is the BSI sensor device 100 of FIG. 1 being processed at a wet etch bench 200. Similar features in FIGS. 1 and 2 are numbered the same for clarity. The BSI sensor device 100 is shown following a grinding process or other suitable process that thins the substrate 112 from the backside 132 as discussed above. The wet etch bench 200 may include a container 202 filled with a chemical etching solution. The chemical etching solution may include a chemical solution 204 of hydrofluoric acid (HF), nitric acid ($HNO_3$), acetic acid ($CH_3COOH$), and water. The chemical solution 204 may be referred to as HNA. The BSI sensor device 100 including the carrier wafer 130 may be dipped into the container 202 with HNA 204 for a predetermined period of time depending on the amount of substrate that needs to be etched. The HNA solution 204 has a high etching selectivity between doped silicon layers, and lightly doped or intrinsic layers. That is, HNA 204 has a high etch rate on the p+ substrate layer 112 and a low etch rate on the p− epi layer 114 (HNA also has a low etch rate on layers having any dopant concentration of n type, oxide layers, and nitride layers). Accordingly, the p− epi layer 114 may be used as an etch stop layer for wet chemical etching 205 of the p+ substrate layer 112 with the HNA 204.

Several disadvantages exist with wet chemical etching the substrate by dipping the substrate in HNA 204 as discussed above in FIG. 2. For example, the HNA 204 used for etching silicon is a self-catalytic reaction process which may make it difficult to control the etch rate (e.g., runaway reaction). Accordingly, the etch rate may be dependent on the amount of time the HNA 204 remains on the substrate 112 as well as the etching area and/or etchant volume. It has been observed that the total thickness variation of the backside surface of the substrate after wet chemical etching at the wet bench discussed above may be as large as 2 to 3 μm. The thickness variation may be caused by various factors such as different etch rates experienced at the center of the substrate as compared to the edge of the substrate. Moreover, the backside surface may have a rough profile (e.g., Rrms>20 nm) due to the fierce and fast reaction of HNA 204 on the substrate 112. The total thickness variation and rough surface may lead to poor device performance due to sensitivity and cross-talk variation in the BSI sensor device 100. Further, the HNA 204 may cause bevel damage 206 to the sides of the device 100 which can lead to low wafer yield. Also, the HNA 204 may cause damage 208 to the backside of the carrier wafer 130 which can adversely affect subsequent semiconductor processing such as depth of focus (DOF) in photolithography.

Figure 3:
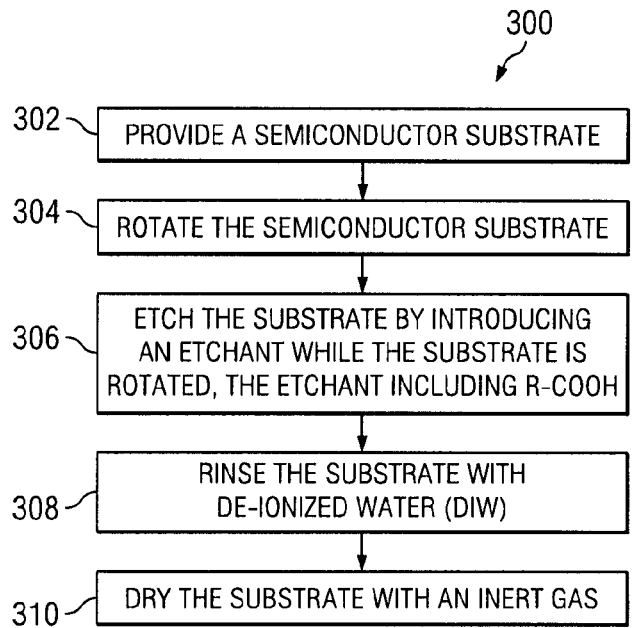
FIG. 3 is a flowchart of a method for fabricating a semiconductor device according to aspects of the present disclosure.
Figure 4A:
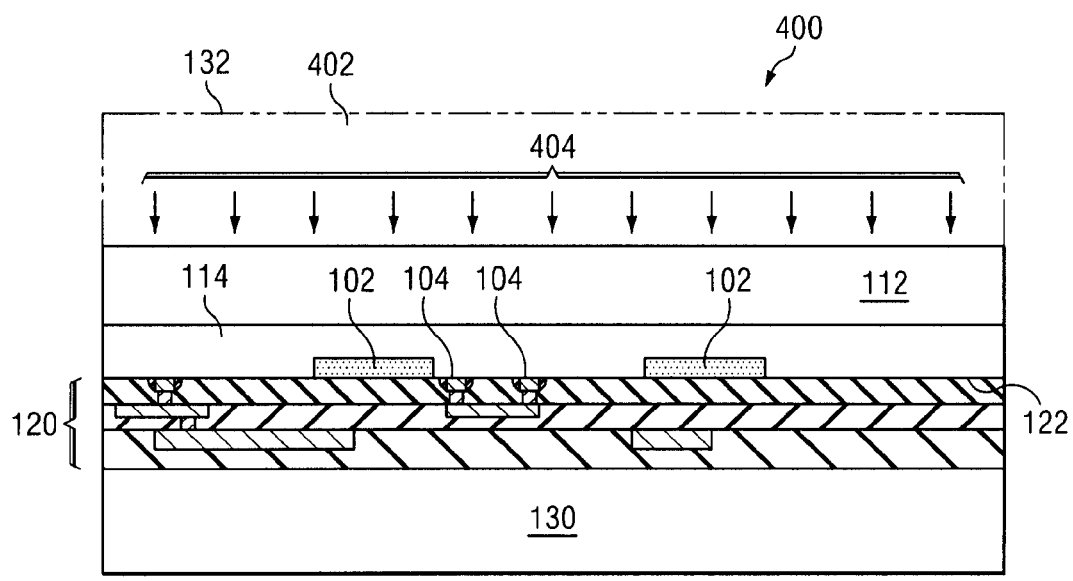
FIGS. 4A, 4B, and 4C are cross-section views of the semiconductor device being fabricated according to the method of FIG. 3.
Figure 4B:
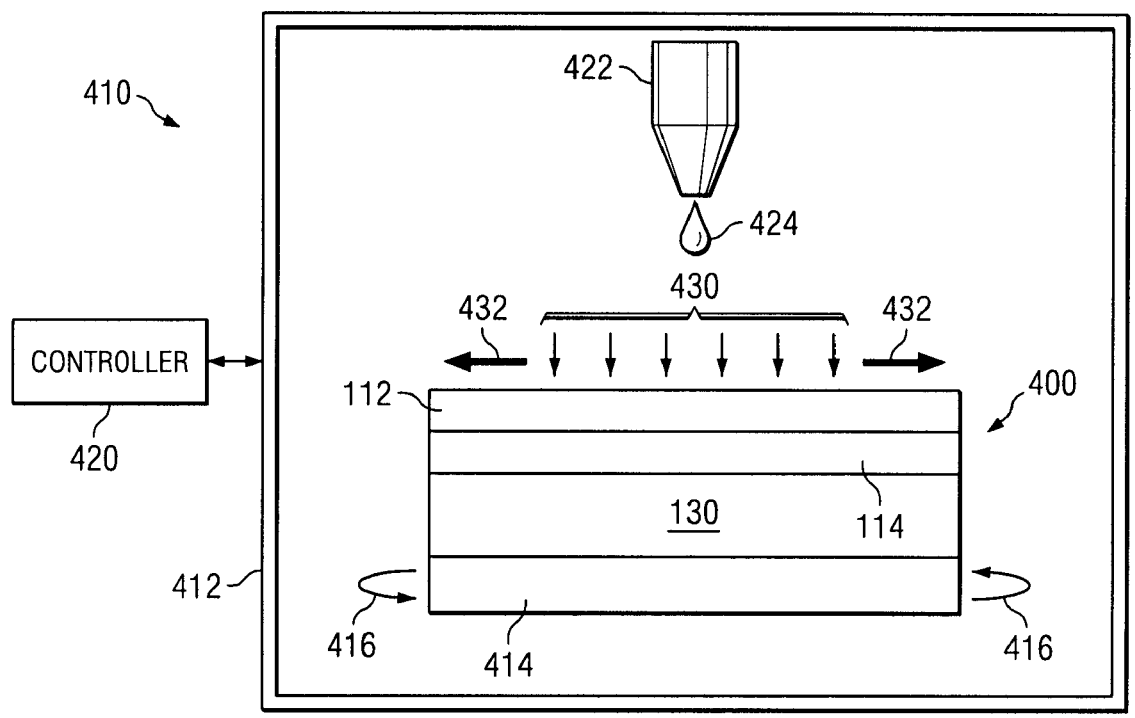
Figure 4C:
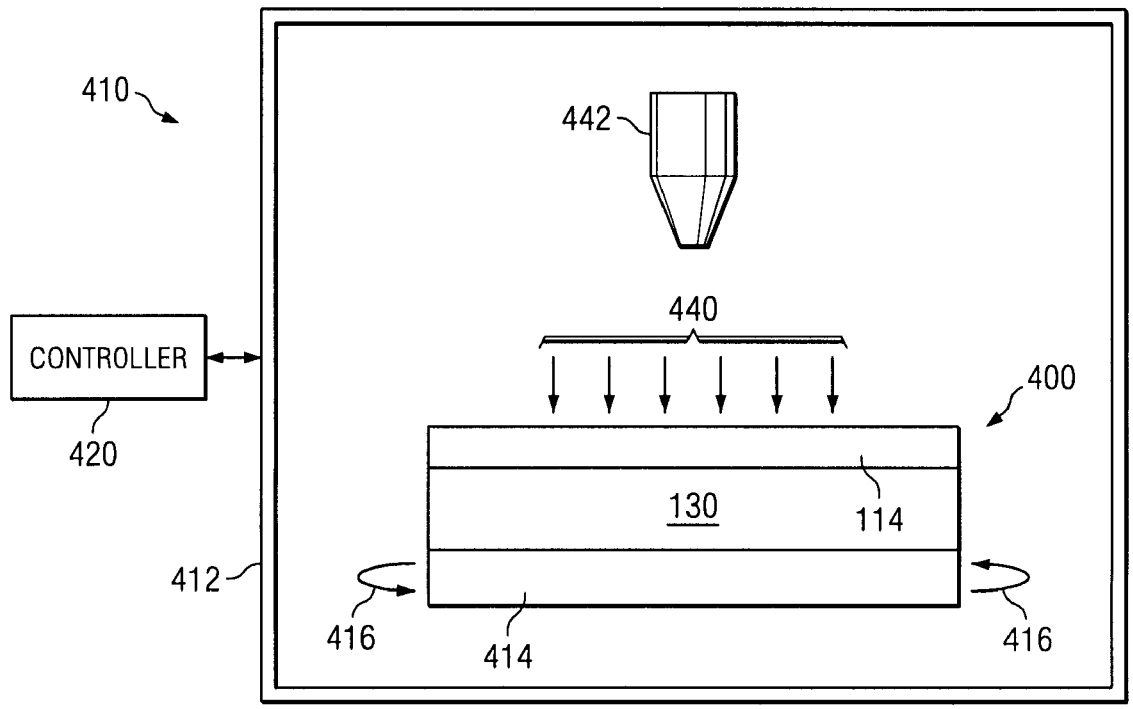

Referring to FIG. 3, illustrated is a flowchart of a method 300 for fabricating a semiconductor device 400 according to various aspects of the present disclosure. Referring also to FIGS. 4A, 4B, and 4C, illustrated is the semiconductor device 400 at various stages being processed according to the method 300 of FIG. 3. The semiconductor device 400 may be similar to the BSI sensor device 100 of FIG. 1. Accordingly, similar features in FIGS. 1 and 4 are numbered the same for the sake of clarity. The method 300 begins with block 302 in which a semiconductor substrate is provided for processing. The semiconductor substrate may be the backside of a device wafer. In FIG. 4A, the semiconductor device 400 is shown with a carrier wafer 130 bonded to the front side 122 of the device so that processing the backside 132 of the substrate 112 may be performed. As previously noted, a portion 402 of the substrate 112 may be removed (e.g., thinned) from the backside 132 by a grinding process 404 or other suitable process. After the grinding process 404, the substrate 112 may undergo further processing to remove the remaining p+ substrate layer including the damaged portion.

The method 300 continues with block 304 in which the semiconductor substrate may be rotated. In FIG. 4B, the semiconductor device 400 may be placed in an apparatus 410 that includes a processing chamber 412 and a stage 414 disposed within the processing chamber. The semiconductor device 400 including the carrier wafer 130 may be secured to the stage 414 by a vacuum suction force or other suitable securing mechanism. The stage 414 may be configured to rotate 416 in a clockwise or counterclockwise direction at various speeds. For example, the stage 414 may be operatively coupled to a motor (not shown), such as a micro-motor, for rotating the stage 414. A controller 420 may be coupled to the motor and the stage 414 to control a rotational speed, rotational direction, and position of the stage. The controller 420 may include a processor for executing various programs stored in memory. The programs may specify a particular recipe to be performed by the apparatus 410, and may depend on the design requirements for the various types of applications.

The method 300 continues with block 306 in which the substrate 112 may be etched by introducing an etchant to the substrate while the substrate is rotated 416 at a predetermined speed. The pre-determined speed may range from about 350 rpm to about 1000 rpm. The apparatus includes a dispenser 422 with a nozzle for dispensing the etchant 424 onto the substrate 112. The dispenser 422 may be positioned such that the nozzle is substantially aligned with the center of the substrate 112. In the present embodiment, the etchant 424 may include a chemical solution of hydrofluoric acid (HF), nitric acid ($HNO_3$), acetic acid ($CH_3COOH$), and water (the chemical solution also referred to as HNA). A composition of the etchant 424 may include HF having a weight percentage from about 5% to about 15%, $HNO_3$ having a weight percentage from about 10% to about 30%, acetic acid having a weight percentage from about 30% to about 70%, and water having a weight percentage from about 5% to about 30%.

The etchant 424 of HNA has a high etch selectivity for doped silicon layers and lightly doped silicon layers. That is, HNA has a high etch rate on the high dopant concentration of p type and HNA has a low etch rate on the light dopant concentration of p type. For example, HNA has an etch rate of greater than 5 μm/min (e.g., approximately 12 μm/min) on a p+ layer having a resistivity of about 0.01 ohm, and an etch rate of less 0.05 μm/min (e.g., approximately 0.01 μm/min) on a p− layer having a resistivity of about 10 ohm. Accordingly, the p− epi layer 114 may be used as an etch stop layer for wet chemical etching of the p+ substrate layer 112 with HNA. Further, the etch rate of HNA is also low on layers having any dopant concentration of n type, oxide layers, and nitride layers, and thus semiconductor layers having these types of configurations may also be used as an etch stop layer in other embodiments (e.g., p+ layer/n− layer, p+ layer/n+ layer, p+ layer/oxide layer, or p+ layer/nitride layer). It has been observed that acetic acid ($CH_3COOH$) in HNA plays an important role in improving etch selectivity (e.g., etch selectivity increases with an increase of acetic acid). Thus, the etchant 424 may include other carboxylic acids, R—COOH, that have similar chemical properties (e.g., low polarity) as acetic acid. The R component may include an alkyl group such as methyl ($CH_3$—), ethyl ($CH_3CH_3$—), or propyl ($CH_3C_2H_4$—) group. These other carboxylic acids may also play an important role in improving etch selectivity of the etchant 424.

The controller 420 may precisely control a flow rate at which the dispenser 422 introduces 430 the etchant 424 to the p+ substrate layer 112. The centrifugal force generated by rotating the substrate 112 may evenly spread the etchant 424 outwardly 432 from the center to the edge of the substrate, and the retention time of the etchant 424 on the entire surface of the substrate 112 may be more consistent. Accordingly, the etch rate on the p+ substrate layer 112 may be easier to control. It has been observed that the etch rate on the p+ substrate layer remains substantially constant and stable over a longer period of time as compared to wet chemical etching by dipping the substrate in HNA as discussed in FIG. 2. As such, the risk of a runaway reaction with respect to HNA on the p+ substrate layer 112 may be greatly minimized, and thus may result in a uniform and smooth surface which is important for subsequent processing of the substrate. For example, it has been observed that a surface roughness is about 10 to 15 nm (in Rrms) utilizing the method 300 of FIG. 3 as compared to a surface roughness greater than 20 nm utilizing the method discussed in FIG. 2 (the surface roughness measured in Rrms). Further, the risk of bevel damage (reference number 206 of FIG. 2) to the semiconductor device 400 and the risk of damage to the backside of the carrier wafer 130 are also reduced utilizing the method 300 of FIG. 3.

In FIG. 4C, the method 300 continues with block 308 in which the semiconductor device 400 including the p− epi layer 114 may be rinsed 440 with de-ionized water (DIW) 442 or other suitable solution as is known in the art. The rinsing 440 may be performed in the processing chamber 412 or may be performed in another processing station. Further, the semiconductor device 400 may be rotated 416 via the stage 414 during the rinsing process. Alternatively, the semiconductor device 400 may optionally remain stationary during the rinsing. The method 300 continues with block 310 in which the semiconductor device 400 may be spun dried using an inert gas such as $N_2$ as is known in the art. The spin drying may also be performed in the processing chamber 412 or may be performed in another processing station. After spin drying, it is understood that the semiconductor device 400 may undergo further processing. For example, the semiconductor device 400 may include a BSI image sensor device in which a color filter layer and a micro lens layer may be formed over the backside for filtering and directing different wavelengths of light radiation to the proper image sensor elements. Further, although the embodiments disclosed above are implemented in a BSI image sensor device, it is understood that the semiconductor device 400 may optionally include other devices such as microelectromechanical systems (MEMS) and 3-D integrated circuits (IC), where thinning and/or etching a silicon substrate is performed during fabrication.

Figure 5:
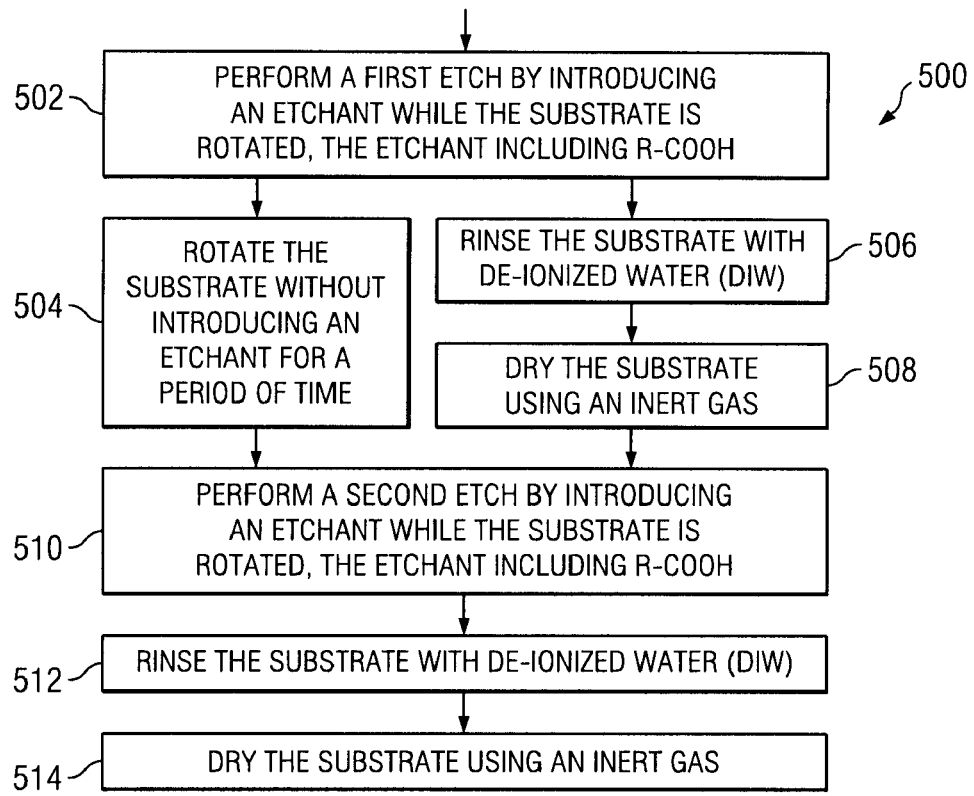
FIG. 5 is a flowchart of an alternative method for fabricating a semiconductor device according to aspects of the present disclosure.

Referring to FIG. 5, illustrated is a flowchart of an alternative method 500 for etching a semiconductor substrate according to various aspects of the present application. The method 500 is similar to the method 300 of FIG. 3 except that the etching process (block 306 of FIG. 3) may be performed in multiple steps according to blocks 502 and 510 for better process control. Further, blocks 302, 304, 308, and 310 have been omitted in the flowchart of method 500 for the sake of simplicity and clarity. It is understood that the method 500 may be carried out using the apparatus 410 of FIG. 4B. The method 500 includes block 502 in which a first etch may be performed on a portion of the p+ substrate layer by introducing an etchant while the substrate is rotated.

In the present embodiment, the etchant may include a chemical solution of hydrofluoric acid (HF), nitric acid ($HNO_3$), acetic acid ($CH_3COOH$), and water (e.g., the chemical solution also referred to as HNA). A composition of the etchant (for the first etch) may include HF having a weight percentage from about 5% to about 15%, $HNO_3$ having a weight percentage from about 10% to about 30%, acetic acid having a weight percentage from about 30% to about 70%, and water having a weight percentage from about 5% to about 30%. The etchant may include other carboxylic acids, R—COOH, that have similar chemical properties (e.g., low polarity) as acetic acid. The R component may include an alkyl group such as methyl ($CH_3$—), ethyl ($CH_3CH_3$—), or propyl ($CH_3C_2H_4$—) group. Accordingly, these other carboxylic acids may also play an important role in improving etch selectivity of the etchant (e.g., for p+ layer/p– layer, p+ layer/n+ layer, p+ layer/n– layer, p+ layer/oxide layer, and p+ layer/nitride layer). The substrate may be rotated at a predetermined speed ranging from about 350 rpm to about 1000 rpm.

The method 500 continues with block 504 in which the semiconductor substrate may be rotated for a period of time without introducing an etchant. Accordingly, the etchant and any residues from the first etch process (block 502) may be substantially removed from the backside surface of the substrate. The period of time may vary depending on the etching recipe and may. Also, the rotational speed may range from about 350 rpm to about 1000 rpm, and may be the same as or different than the rotational speed implemented for the first etch (block 502). Alternatively, the semiconductor substrate may optionally undergo a DIW rinse process 506 and a spin drying process 508 similar to the processes discussed in blocks 308 and 310 of FIG. 3, respectively. Thus, the backside surface of the substrate may be substantially clean for a second etch process that follows as discussed below.

The method 500 continues with block 510 in which a second etch may be performed on a remaining portion of the p+ substrate layer. As previously noted, the p– epi layer underlying the p+ substrate layer may be used as an etch stop layer. In the present embodiment, the etchant may include a chemical solution of hydrofluoric acid (HF), nitric acid ($HNO_3$), acetic acid ($CH_3COOH$), and water (e.g., the chemical solution also referred to as HNA). A composition of the etchant (for the second etch) may include HF having a weight percentage from about 5% to about 15%, $HNO_3$ having a weight percentage from about 10% to about 30%, acetic acid having a weight percentage from about 30% to about 70%, and water having a weight percentage from about 5% to about 30%. The etchant may include other carboxylic acids, R—COOH, that have similar chemical properties (e.g., low polarity) as acetic acid. The R component may include an alkyl group such as methyl ($CH_3$—), ethyl ($CH_3CH_3$—), or propyl ($CH_3C_2H_4$—) group. These other carboxylic acids may also play an important role in improving etch selectivity of the etchant (e.g., for p+ layer/p– layer, p+ layer/n+ layer, p+ layer/n– layer, p+ layer/oxide layer, and p+ layer/nitride layer). The substrate may be rotated at a predetermined speed ranging from about 350 rpm to about 1000 rpm. The method 500 may optionally include blocks 512 and 514 in which the semiconductor substrate may undergo an additional DIW rinse process 512 and a spin drying process 514 following the second etch process (block 510). The DIW rinse process 512 and spin drying process 514 may be similar to the processes discussed in blocks 308 and 310 of FIG. 3, respectively.

It should be noted that the composition of the etchant for the first etch process (block 502) and the composition of the etchant for the second etch process (block 510) may be the same or may be different. That is, different weight percentages for various components of the etchant discussed above may be used for the first etch (block 502) as compared to the second etch (block 510). Further, the rotational speed for the first etch (block 502) and the rotational speed for the second etch (block 510) may be the same or may be different. The various combinations of different or similar weight percentages, and different or similar rotational speeds for the first and second etch processes may be tuned to optimally control the overall wet chemical etching of the p+ substrate layer.

Figure 6:
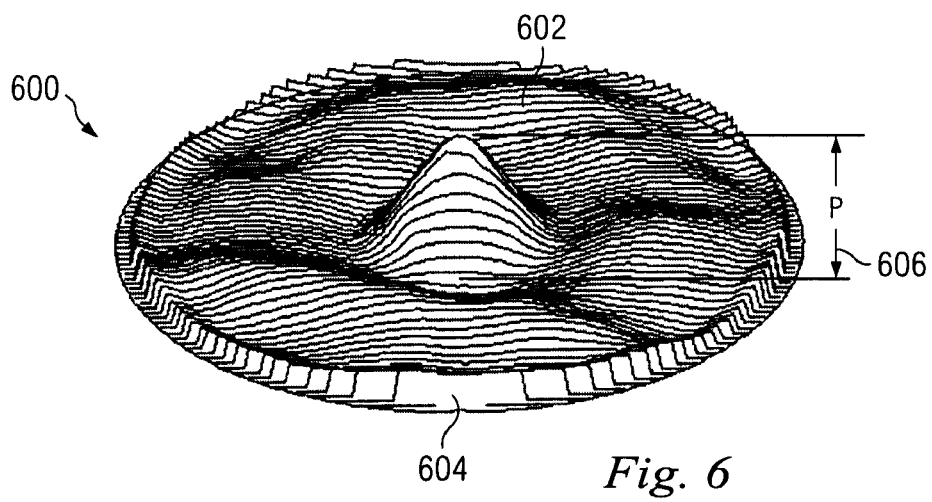
FIG. 6 is a graphical representation of a backside surface of the semiconductor device following processing according to the methods of FIGS. 3 and 5.

Referring to FIG. 6, illustrated is a graphical representation 600 of a backside surface 602 of a semiconductor substrate 604 following spin etching with HNA. The semiconductor substrate 604 may be etched according to the method 300 of FIG. 3 or the method 500 of FIG. 5. It has been observed that the backside surface 602 may developed a peak profile (P) 606 located substantially at the center of the substrate 604. The peak profile (P) 606 may be caused by the spin etching process with HNA (FIGS. 3 and 5), and the grinding process that is performed prior to spin etching as was discussed in FIG. 1 may contribute to the peak profile as well.

Figure 7:
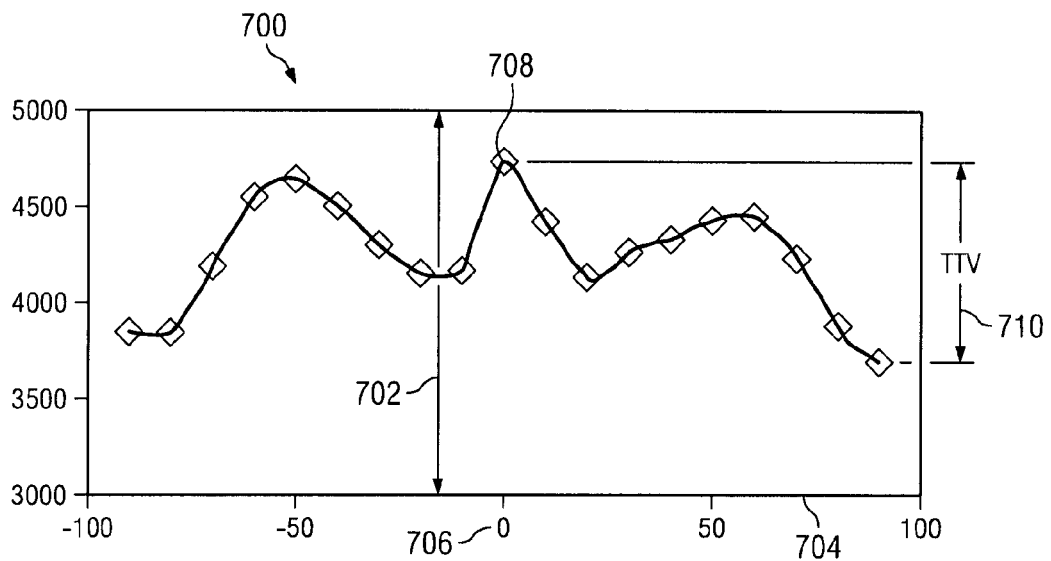
FIG. 7 is a graph showing a thickness of the substrate at various positions across the substrate following processing according to the methods of FIGS. 3 and 5.

Referring to FIG. 7, illustrated is a graph 700 showing a thickness 702 of a semiconductor substrate (y-axis) following a bonding process, grinding process and spin etching process with HNA. The graph 700 shows the thickness 702 of the substrate at various positions 704 across the substrate (x-axis) including the center of the substrate, which is represented at the "0" position 706. The thickness 702 of the substrate may be shown in nanometers (nm), and the positions 704 may be shown in millimeters (mm) measured from the center 706 of the substrate. Accordingly, the substrate includes a diameter of about 200 mm (e.g., 200 mm wafer). The substrate may include a peak profile 708 (similar to the one 606 in FIG. 6) at a region substantially at the center 706 of the substrate. Further, a total thickness variation (TTV) 710 may be about 1 μm (1000 nm), and thus a TTV of this magnitude may not be acceptable for further processing in some applications such as CMOS image sensor applications.

Figure 8:
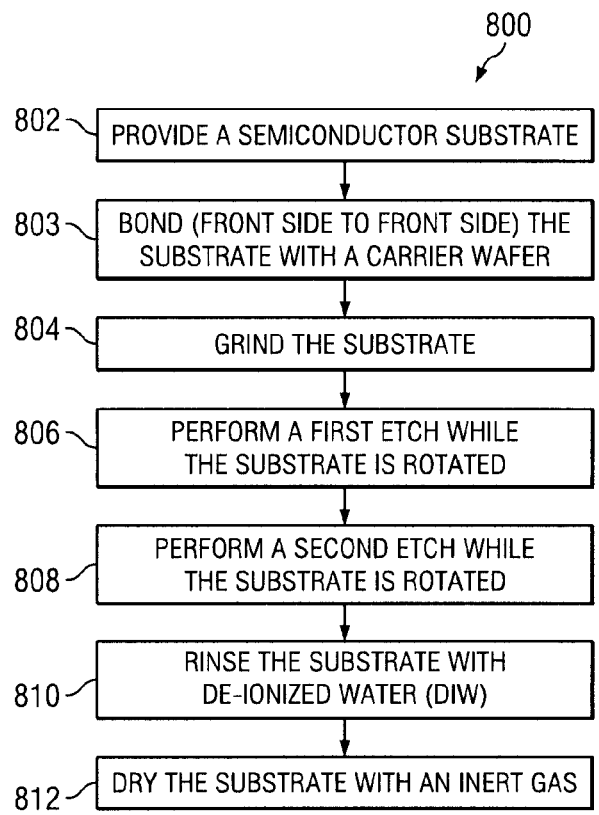
FIG. 8 is a flowchart of a method for etching a semiconductor substrate according to various aspects of the present disclosure.

Referring to FIG. 8, illustrated is a flowchart of a method 800 for etching a semiconductor substrate that results in an improved surface profile as compared to the surface profiles illustrated in FIGS. 6 and 7. The method 800 may be performed in the apparatus 410 of FIG. 4B. The method 800 includes block 802 in which a semiconductor substrate may be provided for processing. The semiconductor substrate may be similar to the one discussed in FIGS. 1, 2, and 4. The method 800 includes block 803 in which the semiconductor substrate at the front side may be bonded to a front side of a carrier wafer for processing the backside of the substrate. The substrate may have a thickness of about 723 μm (8 inches) thick. A grinding process may be performed after bonding to achieve a preliminary thin substrate. The substrate may have a thickness of about 20-200 μm.

The method 800 continues with block 804 in which the substrate may undergo a grinding process. The backside of the substrate may be grinded to thin the substrate to a thickness of about 50 μm. It is understood that the particular thicknesses disclosed herein are mere examples and that other thickness may be implemented depending on the type of application and design requirements of the semiconductor device. The grinding process may have a high removal rate and is well suited for removing a substantial portion of the substrate in a short period of time. However, the grinding process may result in a rough backside surface having a total thickness variation of about 2 to 6 μm, and may cause damage to a portion of the substrate that may extend 10 μm from the backside surface. Accordingly, the substrate may undergo subsequent processing to remove the remaining substrate layer including the damaged portion.

The method 800 continues with block 806 in which a first etch may be performed by introducing an etchant to the substrate while the substrate is rotated at a predetermined speed. The speed may range from about 350 to 1000 rpm, and may depend on a surface profile that is to be achieved from the first etch as will be discussed later below. Also, the dispenser 422 of FIG. 4B may be positioned at a position relative to the center of the substrate, and may introduce the etchant at a predetermined flow rate as will also be discussed below. In the present embodiment, the etchant may include a chemical solution of hydrofluoric acid (HF), nitric acid ($HNO_3$), sulfuric acid ($H_2SO_4$), and phosphoric acid ($H_3PO_4$). A composition of the etchant may include HF having a weight percentage from about 0.5% to about 10%, $HNO_3$ having a weight percentage from about 0.5% to about 20%, $H_2SO_4$ having a weight percentage from about 30% to about 50%, and $H_3PO_4$ having a weight percentage from about 10% to about 30%. The etchant may not have a high selectivity as compared to HNA previously discussed above. Accordingly, the first etch may be performed for a predetermined period of time depending on the amount of the substrate layer to be etched.

Figure 9A:
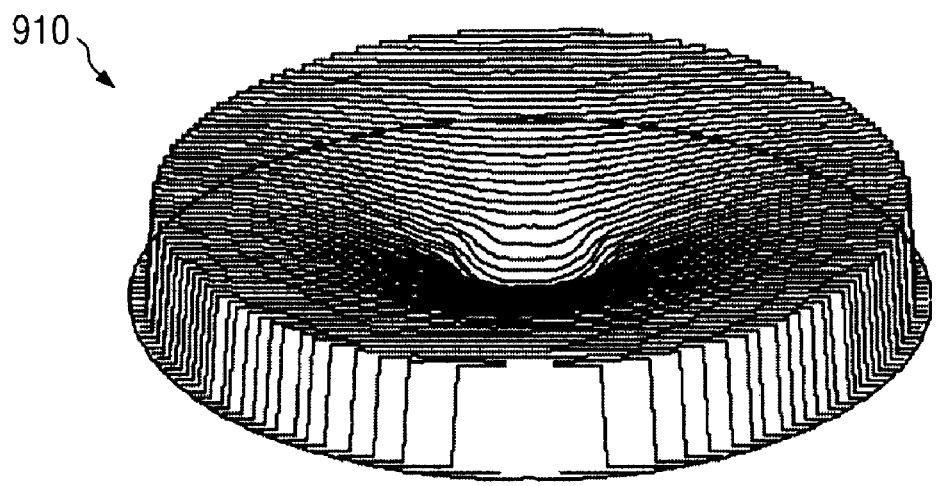
FIGS. 9A, 9B, and 9C are perspective views of various surface profiles that may be obtained by spin etching according to various aspects of the present disclosure.
Figure 9B:
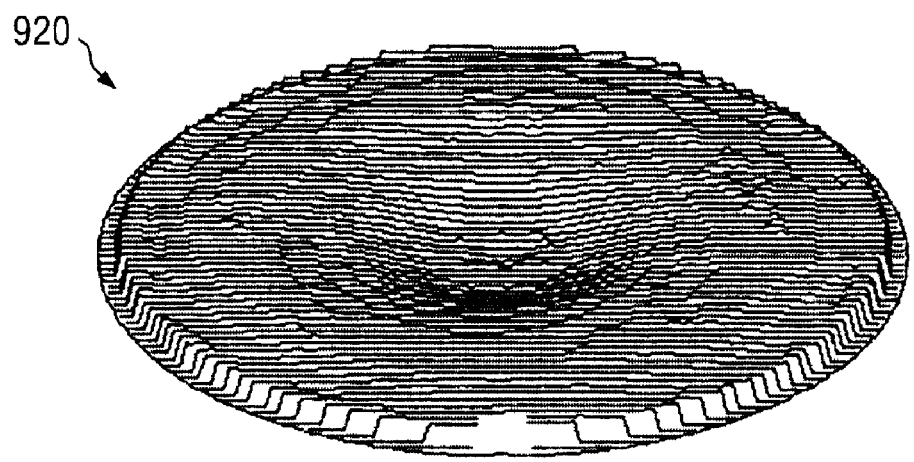
Figure 9C:
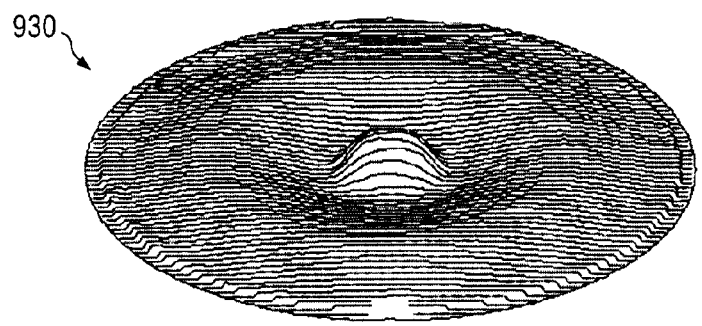

Referring also to FIGS. 9A, 9B, and 9C, illustrated are graphical representations of various profiles that may be obtained from the first etch process of block 806 of FIG. 8. The various profiles may be obtained by adjusting a flow rate of the etchant, a nozzle position of the dispenser, and a rotation speed of the stage. In FIG. 9A, a central concave peak profile 910 may be obtained by implementing a high flow rate for the etchant, a low rotational speed for the stage (e.g., 600 rpm), and a nozzle positioned substantially at the center of the substrate. In FIG. 9B, a flat profile 920 may be obtained by implementing a low flow rate for the etchant (e.g, 0.8 liter/min), a medium rotational speed for the stage (e.g., 1000 rpm), and a nozzle positioned at the center or at a distance from the center of the substrate. In FIG. 9C, a central convex profile 930 may be obtained by implementing a low flow rate (e.g., 1.2 liter/min), a high rotational speed for the stage (e.g., 1500 rpm), and a nozzle positioned at the center or at a distance from the center of the substrate. Accordingly, these various parameters may be optimally tuned to obtain a surface profile that sufficiently compensates for a surface profile resulting from a subsequent spin etching process with HNA.

Referring back to FIG. 8, the method 800 continues with block 808 in which a second etch is performed on the semiconductor substrate. The second etch may be similar to the etch process discussed in block 306 of FIG. 3. Alternatively, the second etch may be similar to the etch process discussed in blocks 502, 504, 506, 508, 510 of FIG. 5. As discussed in FIGS. 6 and 7, spin etching with HNA may cause a peak profile located at the center of the substrate. Accordingly, by performing the first etch process (block 806) to obtain a surface profile that sufficiently compensates for the peak profile (FIGS. 6 and 7), an improved surface profile may be achieved following the second etch process (block 808) as will be shown below in FIG. 10. That is, by tuning the first etch process (block 806) to produce a surface profile similar to the central concave profile 910 of FIG. 9A, the peak profile that typically results from spin etching with HNA (and also the grinding process of block 804) may be compensated, and thus may result in an improved and more uniform surface profile for subsequent processing.

The method 800 continues with block 810 in which the semiconductor substrate may be rinsed with de-ionized water (DIW) or other suitable solution as is known in the art. The rinsing may be performed in the processing chamber 412 of FIG. 4B, or may be performed in another processing station. Further, the semiconductor substrate may be rotated via the stage 414 of FIG. 4B during the rinsing process. Alternatively, the semiconductor substrate may optionally remain stationary during the rinsing. The method 800 continues with block 812 in which the semiconductor substrate may be spun dried using an inert gas such as $N_2$ as is known in the art. The spin drying may also be performed in the processing chamber 412 of FIG. 4B, or may be performed in another processing station. After spin drying, it is understood that the semiconductor substrate may undergo further processing as previously discussed above. It should be noted that the various parameters (e.g., composition of etchants, flow rate of etchants, nozzle position of the dispenser, rotational speed of the substrate, etching time, etc.) associated with the method 800 may be optimally tuned to comply with design requirements, and to fabricate various types of semiconductor devices.

Figure 10:
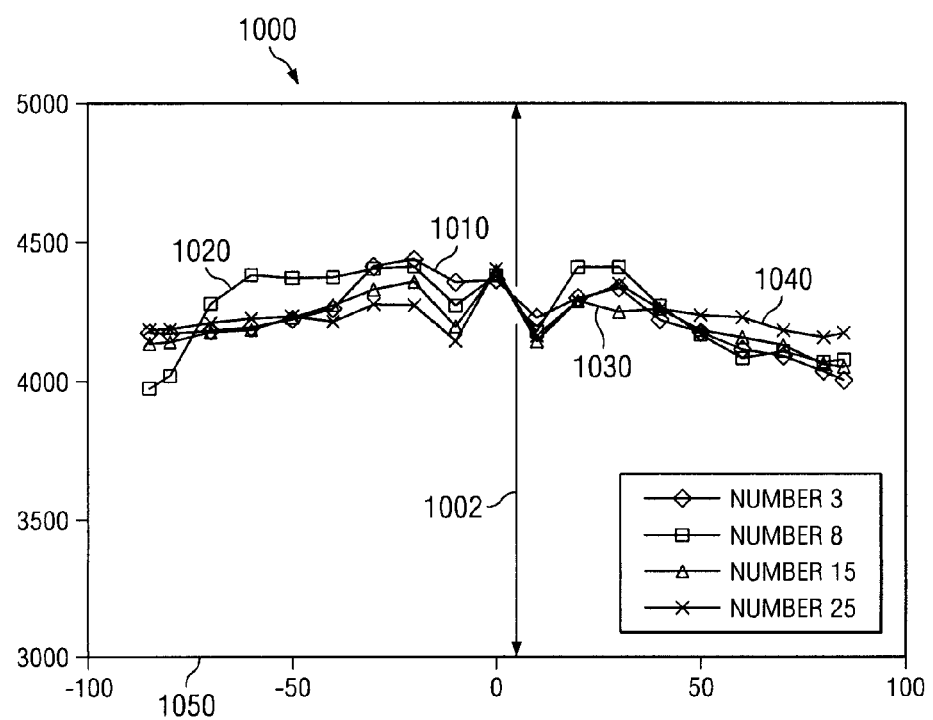
FIG. 10 is a graph showing a thickness of the substrate at various positions across the following processing according to the method of FIG. 8.

Referring to FIG. 10, illustrated is a graph 1000 showing a thickness 1002 (y-axis) of four semiconductor substrates 1010, 1020, 1030, 1040 following processing according to the method 800 of FIG. 8. The graph 1000 shows the thickness 1002 of the substrates 1010, 1020, 1030, 1040 at various positions 1050 (x-axis) including the center of the substrates, which is represented at the "0" position. The thickness 1002 may be shown in nanometers (nm), and the positions 1050 may be shown in millimeters (mm) measured from the center of the substrates. Accordingly, the substrates 1010, 1020, 1030, 1040 each include a diameter of about 200 mm (e.g., 200 mm wafer). The substrates 1010, 1020, 1030, 1040 may include an improved surface profile as compared to the surface profiles illustrated in FIGS. 6 and 7. More specifically, the surface profile proximate to the center of the substrates 1010, 1020, 1030, 1040 may not have as much of a peak profile as was illustrated in FIGS. 6 and 7. Further, a total thickness variation (TTV) for the substrates 1010, 1020, 1030, 1040 may be less than about 0.6 μm (600 nm), and thus the improved surface profiles of the substrates may be acceptable for further processing, for example, in CMOS image sensor applications.

Thus, the present disclosure provides a method for fabricating a semiconductor device which includes providing a semiconductor substrate having a front side and a backside, wherein a plurality of active or passive devices are formed in the front side, rotating the semiconductor substrate, and etching the back side of the semiconductor substrate by introducing a first etchant while the substrate is rotated, the first etchant including an R—COOH. In some embodiments, the method further includes bonding a front side of a carrier wafer to the front side of the semiconductor substrate prior to performing the etching. In some other embodiments, the method further includes grinding the backside of the semiconductor substrate prior to performing the etching. In other embodiments, the semiconductor substrate includes one of a CMOS image sensor, an MEMS device, and a 3-D integrated circuit device. In some other embodiments, the semiconductor substrate includes a p+ substrate layer, wherein the first etch and the second etch are performed on the p+ substrate layer. In still some other embodiments, the semiconductor substrate further includes a semiconductor layer underlying the p+ substrate layer, the semiconductor layer including one of a p− epi layer, n− substrate layer, n+ substrate layer, oxide layer, and nitride layer, where the semiconductor layer functions as an etch stop layer for the etching process.

In other embodiments, the R component of the first etchant includes an alkyl group. In some other embodiments, the alkyl group is one of a methyl ($CH_3$—), an ethyl ($CH_3CH_3$—), and a propyl ($CH_3C_2H_4$—). In other embodiments, the first etchant further includes hydrofluoric acid (HF) and an oxidizing agent. In sill other embodiments, a composition of the first etchant includes hydrofluoric acid (HF) having a weight percentage from about 5% to about 15%, nitric acid ($HNO_3$) having a weight percentage from about 10% to about 30%, and acetic acid ($CH_3COOH$) having a weight percentage from about 30% to about 70%. In some embodiments, the method further includes etching the backside of the semiconductor substrate by introducing a second etchant while the substrate is rotated, the second etchant including an R—COOH, and the second etchant being introduced after introducing the first etchant. In some other embodiments, a composition of the first etchant is different from a composition of the second etchant. In other embodiments, the method further includes rinsing the semiconductor substrate with de-ionized water after introducing the first etchant. In some other embodiments, the method further includes spin drying the semiconductor substrate after introducing the first etchant. In yet other embodiments, the method further includes, after etching the semiconductor substrate, rinsing the semiconductor substrate with de-ionized water, and drying the semiconductor substrate with an inert gas.

Further provided is a method for fabricating a semiconductor device which includes providing a silicon substrate having a front side and a backside, where an integrated circuit is formed in the front side, rotating the silicon substrate, performing a first etch on the backside of the silicon substrate by introducing a first etchant while the substrate is rotated, the first etchant including sulfuric acid ($H_2SO_4$) and phosphoric acid ($H_3PO_4$), and performing a second etch on the backside of the silicon substrate by introducing a second etchant while the substrate is rotated, the second etchant including R—COOH. In some embodiments, the first etchant and second etchant each further include hydrofluoric acid (HF) and an oxidizing agent. In other embodiments, a composition of the first etchant includes hydrofluoric acid (HF) having a weight percentage from about 0.5% to about 10%, nitric acid ($HNO_3$) having a weight percentage from about 0.5% to about 20%, sulfuric acid ($H_2SO_4$) having a weight percentage from about 30% to about 50%, and phosphoric acid ($H_3PO_4$) having a weight percentage from about 10% to about 30%, and a composition of the second etchant includes hydrofluoric acid (HF) having a weight percentage from about 5% to about 15%, nitric acid ($HNO_3$) having a weight percentage from about 10% to about 30%, and acetic acid ($CH_3COOH$) having a weight percentage from about 30% to about 70%.

In other embodiments, the method further includes, after the performing the second etch, performing a third etch by introducing a third etchant while the substrate is rotated, the third etchant including R—COOH. In some other embodiments, a composition of the third etchant includes hydrofluoric acid (HF) having a weight percentage from about 5% to about 15%, nitric acid ($HNO_3$) having a weight percentage from about 10% to about 30%, and acetic acid ($CH_3COOH$) having a weight percentage from about 30% to about 70%.

Although only a few exemplary embodiments of this invention have been described in detail above, those skilled in the art will readily appreciate that many modifications are possible in the exemplary embodiments without material departing from the novel teachings and advantages of this disclosure. For example, although the methods for etching a silicon substrate have been disclosed in the fabrication of a BSI sensor device, it is understood that the methods disclosed herein are applicable to other types of applications that require thinning down the substrate such as in 3-D integrated circuits (IC) and microelectromechanical systems (MEMS).

What is claimed is:

1. A method for fabricating a semiconductor device, the method comprising:

providing a semiconductor substrate having a front side and a backside, wherein a plurality of active or passive devices are formed in the front side;
rotating the semiconductor substrate;
etching the back side of the semiconductor substrate by introducing a first etchant while the substrate is rotated, the first etchant including an R—COOH; and
grinding the backside of the semiconductor substrate prior to performing the etching.

2. The method of claim 1, further comprising bonding a front side of a carrier wafer to the front side of the semiconductor substrate prior to performing the etching.

3. The method of claim 1, wherein the semiconductor substrate includes one of a CMOS image sensor, an MEMS device, and a 3-D integrated circuit device.

4. The method of claim 1, wherein the semiconductor substrate comprises a p+ substrate layer, wherein the etching is performed on the p+ substrate layer.

5. The method of claim 4, wherein the semiconductor substrate further comprises a semiconductor layer underlying the p+ substrate layer, the semiconductor layer comprising one of a p– epi layer, n– substrate layer, n+ substrate layer, oxide layer, and nitride layer, and wherein the semiconductor layer functions as an etch stop layer for the etching process.

6. The method of claim 1, wherein the R component of the first etchant includes an alkyl group, and wherein the alkyl group is one of a methyl ($CH_3$—), an ethyl ($CH_3CH_3$—), and a propyl ($CH_3C_2H_4$—).

7. The method of claim 1, wherein the first etchant further includes hydrofluoric acid (HF) and an oxidizing agent.

8. The method of claim 7, wherein a composition of the first etchant includes hydrofluoric acid (HF) having a weight percentage from about 5% to about 15%, nitric acid ($HNO_3$) having a weight percentage from about 10% to about 30%, and acetic acid ($CH_3COOH$) having a weight percentage from about 30% to about 70%.

9. The method of claim 1, further comprising etching the backside of the semiconductor substrate by introducing a second etchant while the substrate is rotated, the second etchant including an R—COOH, and the second etchant being introduced after introducing the first etchant.

10. The method of claim 9, wherein a composition of the first etchant is different from a composition of the second etchant.

11. The method of claim 9, further comprising rinsing the semiconductor substrate with de-ionized water after introducing the first etchant.

12. The method of claim 9, further comprising spin drying the semiconductor substrate after introducing the first etchant.

13. The method of claim 9, wherein the first etchant is introduced while the semiconductor substrate is rotated at a first spin speed and wherein the second etchant is introduced while the semiconductor substrate is rotated at a second spin speed.

14. The method of claim 9, further comprising, after etching the backside of the semiconductor substrate with the first etchant:
rinsing the semiconductor substrate with de-ionized water; and
drying the semiconductor substrate with an inert gas.

15. A method for fabricating a semiconductor device, comprising:
providing a silicon substrate having a front side and a backside, wherein an integrated circuit is formed in the front side;
rotating the silicon substrate;

performing a first etch on the backside of the silicon substrate by introducing a first etchant while the substrate is rotated, the first etchant including sulfuric acid ($H_2SO_4$) and phosphoric acid ($H_3PO_4$); and performing a second etch on the backside of the silicon substrate by introducing a second etchant while the substrate is rotated, the second etchant including R—COOH.

16. The method of claim 15, wherein the first etchant and second etchant each further include hydrofluoric acid (HF) and an oxidizing agent.

17. The method of claim 16, wherein a composition of the first etchant includes hydrofluoric acid (HF) having a weight percentage from about 0.5% to about 10%, nitric acid ($HNO_3$) having a weight percentage from about 0.5% to about 20%, sulfuric acid ($H_2SO_4$) having a weight percentage from about 30% to about 50%, and phosphoric acid ($H_3PO_4$) having a weight percentage from about 10% to about 30%; and wherein a composition of the second etchant includes hydrofluoric acid (HF) having a weight percentage from about 5% to about 15%, nitric acid ($HNO_3$) having a weight percentage from about 10% to about 30%, and acetic acid ($CH_3COOH$) having a weight percentage from about 30% to about 70%.

18. The method of claim 15, further comprising, after performing the second etch, performing a third etch by introducing a third etchant while the substrate is rotated, the third etchant including R—COOH.

19. The method of claim 18, wherein a composition of the third etchant includes hydrofluoric acid (HF) having a weight percentage from about 5% to about 15%, nitric acid ($HNO_3$) having a weight percentage from about 10% to about 30%, and acetic acid ($CH_3COOH$) having a weight percentage from about 30% to about 70%.

* * * * *